US009313936B2

(12) United States Patent
Seok et al.

(10) Patent No.: US 9,313,936 B2
(45) Date of Patent: Apr. 12, 2016

(54) ELECTRONIC CONTROL APPARATUS FOR VEHICLE USING SLOPED STRUCTURE AND METHOD THEREOF

(71) Applicant: Hyundai Autron Co., Ltd., Seongnam-si (KR)

(72) Inventors: Man Ho Seok, Seongnam-si (KR); Wan Kyu Lee, Yongin-si (KR)

(73) Assignee: HYUNDAI AUTRON CO., LTD., Seongnam-Si (KR)

( * ) Notice: Subject to any disclaimer, the term of this patent is extended or adjusted under 35 U.S.C. 154(b) by 200 days.

(21) Appl. No.: 14/139,861

(22) Filed: Dec. 23, 2013

(65) Prior Publication Data

US 2014/0362534 A1 Dec. 11, 2014

(51) Int. Cl.
| H05K 7/14 | (2006.01) |
| H05K 13/00 | (2006.01) |
| H05K 5/00 | (2006.01) |
| H05K 7/20 | (2006.01) |

(52) U.S. Cl.
CPC .......... *H05K 13/0023* (2013.01); *H05K 5/0039* (2013.01); *H05K 7/20854* (2013.01); *Y10T 29/49002* (2015.01)

(58) Field of Classification Search
CPC .. H05K 5/0039; H05K 5/006; H05K 7/20854
See application file for complete search history.

(56) References Cited

U.S. PATENT DOCUMENTS

| 4,384,368 | A | * | 5/1983 | Rosenfeldt | H05K 7/14 250/551 |
| 4,479,263 | A | * | 10/1984 | Rosenfeldt | H05K 7/14 312/7.1 |
| 4,491,981 | A | * | 1/1985 | Weller | H05K 7/1427 312/7.1 |
| RE33,513 | E | * | 1/1991 | Rosenfeldt | H05K 7/14 250/551 |
| 6,178,094 | B1 | * | 1/2001 | Hakozaki | H05K 7/1418 16/95 R |
| 6,361,350 | B2 | * | 3/2002 | Johnson | 439/374 |
| 6,519,155 | B1 | * | 2/2003 | Walkup | H01L 23/4093 165/80.3 |
| 6,882,533 | B2 | * | 4/2005 | Bash | H05K 7/20636 165/185 |
| 6,940,727 | B2 | * | 9/2005 | Dobbs | H05K 7/1418 29/831 |
| 6,942,506 | B2 | * | 9/2005 | Kimura | H01L 23/4093 174/16.3 |
| 7,133,285 | B2 | * | 11/2006 | Nishimura | H05K 5/0265 165/185 |
| 7,140,885 | B2 | * | 11/2006 | Kitamura | H05K 5/0039 361/752 |
| 7,145,773 | B2 | * | 12/2006 | Shearman | H05K 7/20418 361/715 |
| 7,413,463 | B2 | * | 8/2008 | Matsuo | H05K 5/0039 439/377 |
| 7,667,972 | B2 | * | 2/2010 | Chen | G06K 7/0047 165/104.33 |
| 8,355,256 | B2 | * | 1/2013 | Peng | G06F 1/187 235/441 |

(Continued)

FOREIGN PATENT DOCUMENTS

| DE | 102004002562 A1 * | 8/2005 | .......... H05K 5/0039 |
| JP | 2002-134939 A | 5/2002 | |

(Continued)

*Primary Examiner* — Robert J Hoffberg
(74) *Attorney, Agent, or Firm* — Mayer Brown LLP; Hyunho Park

(57) ABSTRACT

The present disclosure relates to an electronic control apparatus for a vehicle using a sloped structure, and a manufacturing method thereof, in which an appropriate space is maintained with a housing body in order to maintain thermal glue applied onto the PCB when assembling an electronic control apparatus in a sliding manner, and the PCB is assembled by making the PCB be in contact with an upper housing body along a sloped structure formed in a distal end housing at a point at which the slide type assembling is ended, so that the thermal glue may be uniformly applied onto the PCB and be maintained during a slide type manufacturing process.

8 Claims, 4 Drawing Sheets

(56) References Cited

U.S. PATENT DOCUMENTS 8,408,945 B2 * 4/2013 Schober ............... H05K 5/0039
 439/660
2014/0362533 A1 * 12/2014 Shin ..................... H05K 7/2039
 361/707

FOREIGN PATENT DOCUMENTS

| JP | 2007-035741 A | 2/2007 | |
| WO | WO 2014069340 A1 * | 5/2014 | ............. H05K 5/006 |

* cited by examiner

ELECTRONIC CONTROL APPARATUS FOR VEHICLE USING SLOPED STRUCTURE AND METHOD THEREOF

CROSS-REFERENCE TO RELATED APPLICATIONS

This application is based on and claims priority from Korean Patent Application No. 10-2013-0066458, filed on Jun. 11, 2013, with the Korean Intellectual Property Office, the disclosure of which is incorporated herein in its entirety by reference.

TECHNICAL FIELD

The present disclosure relates to an electronic control apparatus for a vehicle, and more particularly, to an electronic control apparatus having a heat radiating structure using a sloped structure in an electronic control apparatus, such as an engine electronic control unit (ECU), for a vehicle.

BACKGROUND

In general, an electronic control apparatus such as an ECU, which electronically controls various types of devices, is equipped in a vehicle. The electronic control apparatus receives information from sensors or switches installed at each part of the vehicle. The electronic control apparatus serves to perform various electronic controls for promoting improvement of a riding quality and safety of the vehicle or providing various items of convenience to a driver and a passenger by processing the received information.

For example, the electronic control apparatus such as the ECU, which controls states of an engine, an automatic transmission, an anti-lock brake system (ABS), and the like in the vehicle using a computer, also serves to control all parts in the vehicle, such as a driving system, a braking system, and a steering system as well as the automatic transmission as the vehicle and the computer have been developed in terms of performance.

The electronic control apparatus such as the ECU has a structure that includes a case which includes an upper cover and a lower base, a printed circuit board (PCB) which is accommodated in the case, a connector which is coupled to a front end of the PCB so as to be connected to an external socket, and the like.

The case has a structure in which the cover and the base are assembled together with the PCB while covering the PCB, and particularly, the connector, which is interposed between the cover and the base when the cover and the base are assembled, forms a sealing structure with the cover side and the base side.

The electronic control apparatus includes a high integrated control circuit means and thus requires a predetermined sealing structure that may prevent external moisture or foreign substances from flowing into the electronic control apparatus, and the electronic control apparatus mainly adopts a sealing structure in which the cover and the base are typically assembled together with the connector in a state in which sealing materials are inserted on binding parts between the cover and the base and the connector so as to protect the PCB and the like in the electronic control apparatus.

In the meantime, the electronic control apparatus may be assembled in a sliding manner. In this case, it is difficult to apply thermal glue for a close contact with the housing when the PCB is pushed into and assembled with one piece housing. Since the PCB is in close contact with the housing in the sliding manner, the applied thermal glue is moved, so that the PCB may not be entirely bonded to the housing. Accordingly, performance of heat radiation discharged through the housing may deteriorate in a portion including no thermal glue applied onto the PCB.

SUMMARY

The present disclosure has been made in an effort to provide an electronic control apparatus for a vehicle using a sloped structure and a manufacturing method thereof, in which an appropriate space is maintained with a housing body in order to maintain thermal glue applied onto the PCB when assembling an electronic control apparatus in a sliding manner, and the PCB is assembled by making the PCB be in contact with an upper housing body along the sloped structure formed in a distal end housing at a point at which the slide type assembling is ended, so that the thermal glue may be uniformly applied onto the PCB and be maintained during a slide type manufacturing process.

An exemplary embodiment of the present disclosure provides an electronic control apparatus for a vehicle, including: a printed circuit board (PCB) configured to electrically control each part of the vehicle, and having one surface onto which thermal glue is applied; a connector cover including a connector part electrically connected and coupled with the PCB, and a cover coupling part for coupling with a housing; a housing body which is in close contact with the PCB in a sliding manner to be assembled; and a distal end housing assembled with a distal end of the housing body and including a sloped structure, in which the applied thermal glue is maintained during the assembling of the PCB onto which the thermal glue is applied with the housing body in the sliding manner, and the PCB is in close contact and assembled with the housing body along a sloped structure formed in the distal end housing at a point at which the assembling of the PCB is completed in the sliding manner.

The housing body may include a slide guide including a guide groove so that the PCB is in contact and assembled with the housing body in the sliding manner.

The thermal glue may be applied on one surface of the PCB in a shape corresponding to a shape of the slide guide formed at the housing body.

The formed guide groove of the housing body may be higher than the PCB on which the thermal glue is applied so that the applied thermal glue is maintained during the assembling of the PCB in the sliding manner.

The distal end housing may include the sloped structure including at least one inclined surface from a point at which the assembling of the PCB is completed in the sliding manner.

The distal end housing may include the sloped structure in which a part of an inclined surface is formed in a horizontal surface, the PCB is in contact with the housing body along the inclined surface, and the PCB is in close contact with an internal side of the distal end housing along the formed horizontal surface.

Another exemplary embodiment of the present disclosure provides a method of manufacturing an electronic control apparatus, including: assembling a distal end housing including a sloped structure with a distal end of a housing body; applying thermal glue onto one surface of a printed circuit board (PCB) configured to electrically control each part of a vehicle; inserting the PCB into the distal end housing side in a sliding manner so that the applied thermal glue is maintained; making the PCB be in close contact with the housing body along the sloped structure formed in the distal end housing at a point at which the assembling of the PCB is completed in the sliding manner; and coupling a connector cover including a connector part electrically connected and coupled with the PCB and a cover coupling part for coupling with a housing with the housing body after the PCB is in close contact with the housing body.

The inserting of the PCB may include inserting the PCB along a slide guide formed including a guide groove formed at the housing body in the sliding manner.

The making of the PCB be in close contact with the housing body may include making the PCB be in close contact with the housing body along at least one inclined surface when the sloped structure includes at least one inclined surface.

The making of the PCB be in close contact with the housing body may include making the PCB be in close contact with the housing body in the inclined surface in a case where the sloped structure has the horizontal surface in part together with the inclined surface, and making the PCB be in close contact with an internal side of the distal end housing along the formed horizontal surface.

According to the exemplary embodiments of the present disclosure, an appropriate space is maintained with the housing body in order to maintain thermal glue applied onto the PCB when assembling the electronic control apparatus in the sliding manner, and the PCB is assembled by making the PCB be in contact with the upper housing body along the sloped structure formed in the distal end housing at a point at which the slide type assembling is ended, thereby achieving an effect in that the thermal glue may be uniformly applied onto the PCB and be maintained during a slide type manufacturing process.

According to the exemplary embodiments of the present disclosure, the electronic control apparatus is formed by the can type one piece housing, thereby achieving an effect in that a process of the electronic control apparatus is simplified and a defect generation possibility is decreased and thus production efficiency is improved.

According to the exemplary embodiments of the present disclosure, the process is simplified and the production efficiency is improved, thereby achieving an effect of decreasing production costs.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
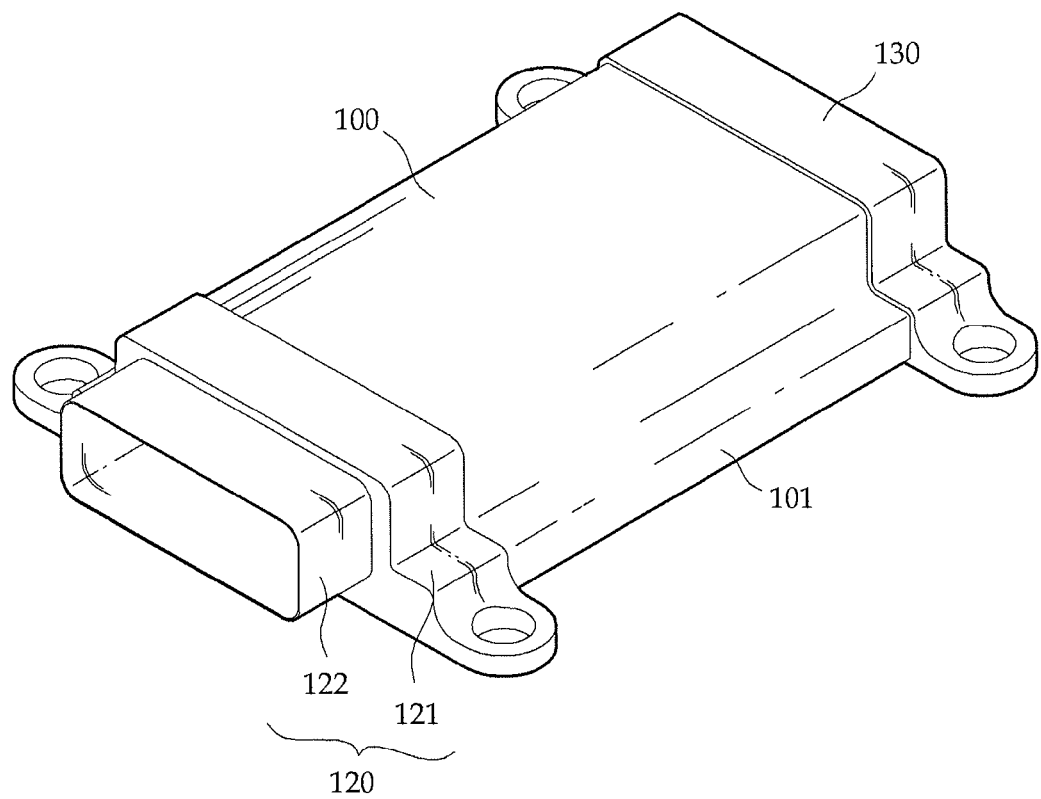
FIG. 1 shows a perspective view illustrating an electronic control apparatus for a vehicle using a sloped structure according to an exemplary embodiment of the present disclosure.

Hereinafter, an exemplary embodiment of the present disclosure will be described in detail with reference the accompanying drawing. A configuration of the present disclosure and an operational effect thereof will be clearly understood through the detailed description below. In the following description, the same elements will be designated by the same reference numerals although they are shown in different drawings, and a detailed explanation of known related functions and constitutions may be omitted when it is determined that the detailed explanation obscures the subject matter of the present disclosure.

Figure 4:
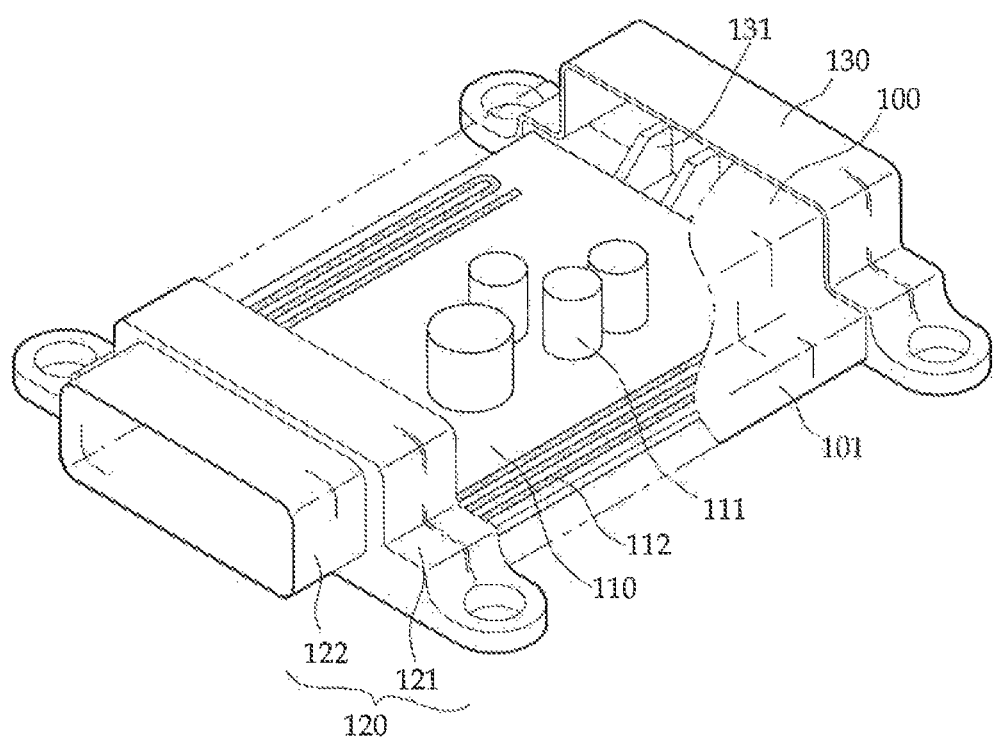
FIG. 4 shows an internal structure diagram illustrating the electronic control apparatus for the vehicle using the sloped structure according to the exemplary embodiment of the present disclosure.

FIG. 1 shows a perspective view illustrating an electronic control apparatus for a vehicle using a sloped structure according to an exemplary embodiment of the present disclosure. FIG. 4 shows an internal structure diagram illustrating the electronic control apparatus for the vehicle using the sloped structure according to the exemplary embodiment of the present disclosure.

The electronic control apparatus is a component including an PCB, for example, an integrated control circuit means, such as a PCB 110, electrically controlling each part of the vehicle, and requires a heat radiating structure of discharging heat generated from a heating element 111 positioned on the PCB 110 into the atmosphere, and a housing structure for preventing external moisture or foreign substances from flowing into the electronic control apparatus. The electronic control apparatus accommodates the PCB 110 and the like inside thereof and has a can type one piece housing form.

As illustrated in FIGS. 1 and 4, the electronic control apparatus includes a housing body 100, a connector cover 120, and a distal end housing 130. Here, the housing body 100 has a slide guide 101 for guiding the PCB 110 when the PCB 110 is inserted into the housing body 100 in a sliding manner. The connector cover 120 includes a cover coupling part 121 and a connector part 122.

The housing body 100 is fitted to the connector cover 120 coupled with the PCB 110 in the sliding manner to be coupled with the connector cover 120. That is, the housing body 100 is coupled with the connector cover 120 in the sliding manner. In this case, when the PCB 110, onto which thermal glue 112 is applied, is inserted in the housing body 100 in the sliding manner, a lower portion of the slide guide 101 is in close contact with the PCB 110 so that the housing body 100 is assembled with the PCB 110. Here, the thermal glue 112 is a thermal conductive material. In a case where the thermal glue 112 is in a gel state, the thermal glue 112 is hardened so that the thermal glue 112 may be fixed after completing the assembling.

The housing body 100 includes the slide guide 101 provided with a guide groove for helping the assembling of the housing body 100 with the PCB 110 in the sliding manner. The guide groove of the slide guide 101 of the housing body 100 is higher than the PCB 110, onto which the thermal glue 112 is applied, so that the thermal glue 112 uniformly applied before the PCB 110 is inserted is maintained during the assembling of the PCB 110 in the sliding manner. The slide guide 101 has an appropriate space with the PCB 110 in order to maintain the applied thermal glue 112.

The connector cover 120 will be described. The cover coupling part 121 and the connector part 122 may be a separate type, or may be integrally formed for waterproof performance. The cover coupling part 121 is coupled with the housing body 100. The connector part 122 is coupled and electrically connected with the PCB 110. The connector part 122 includes a connector pin, and is electrically connected with the PCB 110 through the connector pin. The connector pin may include a plurality of inner pins for connection with the PCB 110, and a plurality of outer pins for connection with the outside. The connector part 122 may be physically fitted to the PCB 110, and may electrically connect the PCB 110 through the inner pin. The connector part 122 may be formed in an integral form of a front end portion exposed to the outside and a rear end portion.

The PCB 110 may include an electric element, a heating element, or a heat radiating plate at a top side or a bottom side. The connector cover 120 is connected with the connector part 122 outside thereof, and is connected with the PCB 110 inside the housing. As illustrated in FIG. 4, the PCB 110 includes heating elements 111 on one surface thereof, and the thermal glue 112 is applied onto side surface portions of the one surface. The thermal glue 112 is for the purpose of discharging heat generated from the heating elements 111.

Figure 2:
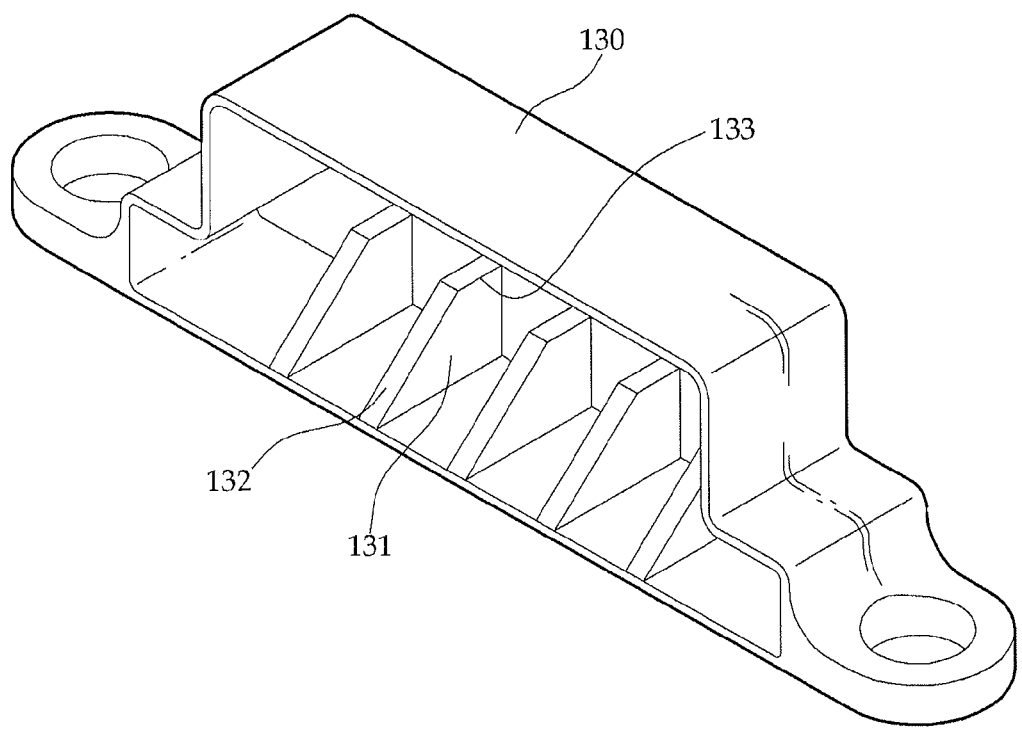
FIG. 2 shows an internal structure diagram illustrating a distal end housing including the sloped structure according to the exemplary embodiment of the present disclosure.

FIG. 2 shows an internal structure diagram illustrating the distal end housing including the sloped structure according to the exemplary embodiment of the present disclosure.

As illustrated in FIG. 2, the distal end housing 130 is coupled with a distal end of the housing body 100. The distal end housing 130 includes a sloped structure 131 at a point at which the distal end housing 130 is coupled with the housing body 100.

The sloped structure 131 is a structure having a gradient, that is, an angle of inclination, and has an inclined surface 132 having an angle of inclination from a point at which the distal end housing 130 is coupled with the distal end of the housing body 110. The sloped structure 131 may additionally have a horizontal surface 133 together with the inclined surface 132. The sloped structure 131 performs a function of closely contacting the PCB 110 to an upper portion of the slide guide 101 of the housing body 100 along the inclined surface 132 from the point at which the assembling of the PCB 110 is completed in the sliding manner. As described above, as the PCB 110 is inserted in the sliding manner by the sloped structure 131 in which the inclined surface 132 is formed, the thermal glue 112 is in closer contact with the upper portion of the slide guide 101 of the housing body 100.

Here, the inclined surface 132 may be formed of at least one inclined surface 132 as illustrated in FIG. 2. An angle of inclination by at least one inclined surface 132 may be differently formed according to the PCB 110 assembled in the sliding manner. For example, when the angle of inclination by the inclined surface 132 is small, little force is applied to the PCB 110 assembled in the sliding manner, so that the PCB 110 may be easily in close contact with the internal side of the distal end housing 130. A pressure at which the PCB 110 is in close contact with the upper portion of the slide guide 101 is decreased, but the PCB 110 may be easily assembled in the sliding manner. In contrast, when the angle of inclination by the inclined surface 132 is larger, large force is applied to the PCB 110 assembled in the sliding manner, so that the PCB 110 may be difficult to be in close contact with the internal side of the distal end housing 130. A pressure at which the PCB 110 is in close contact with the upper portion of the slide guide 101 is increased, so that heat radiating performance may be improved. That is, the angle of inclination of the inclined surface 132 may be differently formed considering heat radiating performance or assembling performance according to a degree of close contact between the PCB 110 and the upper portion of the slide guide 101.

In the meantime, when the slope structure 131 has the horizontal surface 133 in part together with the inclined surface 132, the PCB 110 may be in close contact with the upper portion of the slide guide 101 of the housing body 100 along the inclined surface 132, may be completely in close contact with the upper portion of the slide guide 101 up to the highest height of the inclined surface 132, and then may be in contact with the internal side of the distal end housing 130 along the horizontal surface 133. This is for the purpose of supplementing the fact that the PCB 110 is in close contact with the upper portion of the slide guide 101 by the angle of inclination of the inclined surface 132, but on the contrary, there is no portion at which the PCB 110 is fixed along the inclined surface 132 in a down direction.

Figure 3:
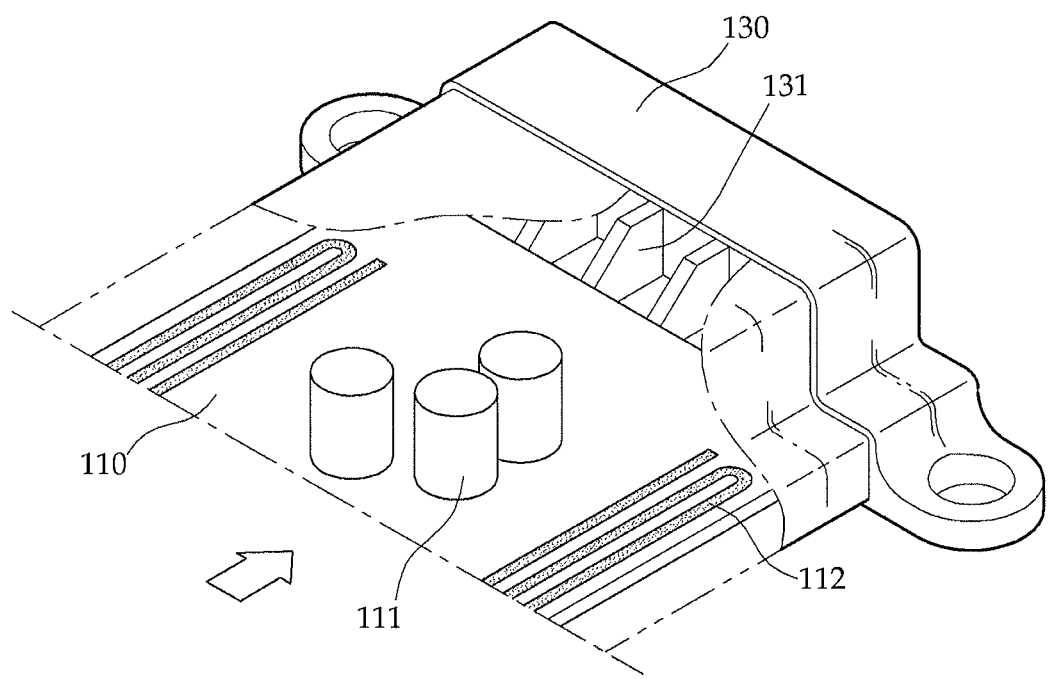
FIG. 3 shows an explanation diagram illustrating a slide manufacturing process of the electronic control apparatus for the vehicle using the sloped structure according to the exemplary embodiment of the present disclosure.

FIG. 3 shows an explanation diagram illustrating a slide manufacturing process of the electronic control apparatus for the vehicle using the sloped structure according to the exemplary embodiment of the present disclosure.

In the manufacturing process of the electronic control apparatus, the distal end housing 130 including the sloped structure 131 is assembled with the distal end of the housing body 100.

In the manufacturing process of the electronic control apparatus, the thermal glue 112 is applied onto one surface of the PCB 110 electrically controlling each part of the vehicle.

In the manufacturing process of the electronic control apparatus, the PCB 110 is inserted into the distal end housing 130 side in the sliding manner so that the applied thermal glue 112 is maintained. In this case, in the manufacturing process of the electronic control apparatus, the PCB 110 is inserted along the slide guide 101 provided with the guide groove formed at the housing body in the sliding manner.

In the manufacturing process of the electronic control apparatus, the PCB 110 is in close contact with the housing body 100 along the sloped structure 131 formed at the distal end housing 130 at a point at which the assembling of the slide type is completed. Here, in the manufacturing process of the electronic control apparatus, when the sloped structure 131 has the horizontal surface 133 in part together with the inclined surface 132, the PCB 110 is in close contact with the housing body 100 along the inclined surface 132, and the PCB 110 may be in close contact with the internal side of the distal end housing 130 along the horizontal surface 133. Through the manufacturing process, as the PCB 110 is inserted in the sliding manner by the sloped structure 131 in which the inclined surface 132 is formed, the thermal glue 112 is in closer contact with the upper portion of the slide guide 101 of the housing body 100.

In the manufacturing process of the electronic control apparatus, the PCB 110 is in close contact with the housing body 100, and then the connector cover 120 including the connector part 122 electrically connected and coupled with the PCB 110 and the cover coupling part 121 for the coupling with the housing is coupled with the housing body. Then, the assembling of the electronic control apparatus is completed in the sliding manner as illustrated in FIG. 4.

Then, in the manufacturing process of the electronic control apparatus illustrated in FIG. 4, in a case where the thermal glue 112 is in a gel state, the thermal glue may be hardened so as to be fixed after completing the assembling.

According to the present disclosure, an appropriate space is maintained with the housing body in order to maintain the thermal glue applied onto the electronic control element when assembling the electronic control apparatus in the sliding manner, and the electronic control element is assembled by making the electronic control element be in contact with the upper housing body along the sloped structure formed in the distal end housing at a point at which the slide type assembling is ended, so that the thermal glue may be uniformly applied onto the electronic control element and be maintained during a slide type manufacturing process. At this point, since the present disclosure that is beyond the limit of the known art does not just utilize the related art but commercial or business possibility of applied equipment is sufficient and can be clearly implemented in practice, the present disclosure has industrial applicability.

From the foregoing, it will be appreciated that various embodiments of the present disclosure have been described herein for purposes of illustration, and various modifications may be made by those skilled in the art without departing from the scope and spirit of the present disclosure. Accordingly, the various embodiments disclosed herein are not intended to be limiting. The scope of the present disclosure shall be construed on the basis of the following claims in such a manner that all of the technical ideas included within the scope equivalent to the claims belong to the present disclosure.

What is claimed is:

1. An electronic control apparatus for a vehicle, comprising:
    a printed circuit board (PCB) configured to electrically control a respective part of the vehicle, and having one surface onto which thermal glue is applied;
    a housing body configured to include at least one slide guide, the at least one slide guide including a guide groove so that a side of the PCB opposite to the one surface is configured to be in close contact with a lower portion of the guide groove when the PCB is being assembled with the housing body in a sliding manner, and the guide grove of the housing body is configured to allow the PCB to be inserted in the guide groove so that the applied thermal glue to be maintained when the PCB is being assembled with the housing body in the sliding manner;
    a connector cover including a connector part electrically connected and coupled with the PCB, and a cover coupling part for coupling with a proximal end of the housing body; and
    a distal end housing assembled with a distal end of the housing body and including a sloped structure,
    wherein when the PCB is being assembled with the housing body in the sliding manner, a side of the PCB opposite to the one surface is configured to slide along the sloped structure formed in the distal end housing, and the one surface of the PCB is configured to be in close contact with the an upper portion of the guide groove.

2. The electronic control apparatus of claim 1, wherein the thermal glue is applied on the one surface of the PCB in a shape corresponding to a shape of the at least one slide guide of the housing body.

3. The electronic control apparatus of claim 1, wherein the distal end housing includes the sloped structure including at least one inclined surface.

4. The electronic control apparatus of claim 1, wherein the distal end housing includes the sloped structure having a horizontal surface in part with an inclined surface, as the PCB is being assembled with the housing body in the sliding manner along the inclined surface of the distal end housing, and the PCB becomes closer with an internal side of the distal end housing formed along the horizontal surface.

5. A method of manufacturing an electronic control apparatus, comprising:
    assembling a distal end housing including a sloped structure to a distal end of a housing body;
    applying thermal glue onto one surface of a printed circuit board (PCB), the PCB configured to electrically control a respective part of a vehicle;
    inserting the PCB into a proximal end of the housing body and into the distal end housing in a sliding manner so that the applied thermal glue is maintained;
    making the PCB be in close contact with the housing body along the sloped structure formed in the distal end housing at which point the assembling of the PCB with the housing body is completed in the sliding manner; and
    coupling a connector cover including a connector part electrically connected and coupled with the PCB and a cover coupling part for coupling with the proximal end of the housing body after the PCB is in the close contact with the housing body.

6. The method of claim 5, wherein the inserting the PCB includes inserting the PCB along at least one slide guide, the at least one slide guide including a guide groove formed in the housing body.

7. The method of claim 5, wherein the making the PCB be in the close contact with the housing body includes making the PCB be in the close contact with the housing body along at least one inclined surface when the sloped structure includes the at least one inclined surface.

8. The method of claim 7, wherein the making the PCB be in the close contact with the housing body includes making the PCB be in the close contact with the housing body along the at least one inclined surface where the sloped structure has a horizontal surface together with the at least one inclined surface, and making the PCB be closer to an internal side of the distal end housing formed along the horizontal surface.

* * * * *